US012625438B2

(12) United States Patent (10) Patent No.: US 12,625,438 B2
Baggen et al. (45) Date of Patent: May 12, 2026

(54) INTERFACE PLATE, INSPECTION SYSTEM AND METHOD OF INSTALLING AN INSPECTION SYSTEM

(71) Applicant: ASML Netherlands B.V., Veldhoven (NL)

(72) Inventors: Marcel Koenraad Marie Baggen, Nuenen (NL); Jasper Hendrik Grasman, Waalre (NL); Chin-Fa Tu, San Jose, CA (US); Lucas Kuindersma, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 615 days.

(21) Appl. No.: 17/915,087

(22) PCT Filed: Mar. 24, 2021

(86) PCT No.: PCT/EP2021/057640
§ 371 (c)(1),
(2) Date: Sep. 27, 2022

(87) PCT Pub. No.: WO2021/191311
PCT Pub. Date: Sep. 30, 2021

(65) Prior Publication Data
US 2023/0152717 A1 May 18, 2023

Related U.S. Application Data

(60) Provisional application No. 63/000,970, filed on Mar. 27, 2020.

(51) Int. Cl.
*G03F 7/00* (2006.01)

(52) U.S. Cl.
CPC ........ *G03F 7/70833* (2013.01); *G03F 7/7085* (2013.01); *G03F 7/70975* (2013.01)

(58) Field of Classification Search
CPC ............... G03F 7/70833; G03F 7/7085; G03F 7/70975; G03F 7/70616; G03F 7/708
See application file for complete search history.

(56) References Cited

U.S. PATENT DOCUMENTS 4,240,688 A * 12/1980 Sotolongo .............. H02G 3/185
439/535
7,546,780 B2 * 6/2009 Santos ................... G01D 11/30
73/866.5

(Continued)

FOREIGN PATENT DOCUMENTS

CN 101109908 B * 2/2011 ................ G01J 1/04
CN 102109778 A * 6/2011
(Continued)

OTHER PUBLICATIONS

Office Action of the Intellectual Property office of Taiwan issued in related Taiwanese Patent Application No. 110111010; mailed Feb. 25, 2022 (6 pgs.).

(Continued)

*Primary Examiner* — Octavia Hollington
(74) *Attorney, Agent, or Firm* — FINNEGAN, HENDERSON, FARABOW, GARRETT & DUNNER LLP

(57) ABSTRACT

An interface plate for mounting an apparatus or an assembly of an apparatus to a floor or floor plate is described, the interface plate comprising: an install block having an install surface configured to receive an interface surface of the apparatus or assembly; an adjustment mechanism configured to adjust a position or orientation of the install block relative to the floor or floor plate; and a mounting mechanism configured to rigidly mount the install block to the floor or floor plate.

20 Claims, 12 Drawing Sheets

(56)                References Cited

U.S. PATENT DOCUMENTS

| | | | | |
|---|---|---|---|---|
| 7,692,881 B2 * | 4/2010 | Kwan | .................... | G02B 7/02 |
| | | | | 359/811 |
| 8,368,868 B2 * | 2/2013 | Vermeulen | ......... | G03F 7/70866 |
| | | | | 355/92 |
| 8,739,383 B2 * | 6/2014 | Phillips | .............. | G03F 7/70833 |
| | | | | 355/30 |
| 8,780,329 B2 * | 7/2014 | Hara | ...................... | G03F 7/709 |
| | | | | 355/77 |
| 9,744,634 B2 * | 8/2017 | Plank | ................... | B23Q 1/037 |
| 9,891,540 B2 * | 2/2018 | Ebert | ................... | G03F 9/7088 |
| 9,977,349 B2 * | 5/2018 | Butler | ............... | F16F 15/0232 |
| 2009/0168036 A1 | 7/2009 | Hara et al. | | |
| 2010/0051832 A1 * | 3/2010 | Nishisaka | .......... | G03F 7/70975 |
| | | | | 250/504 R |
| 2016/0334718 A1 | 11/2016 | Butler et al. | | |
| 2018/0267410 A1 * | 9/2018 | Hempenius | ........ | G03F 7/70725 |
| 2023/0205101 A1 * | 6/2023 | Keulen | .............. | G03F 7/70775 |
| | | | | 355/30 |

FOREIGN PATENT DOCUMENTS

| | | | | | |
|---|---|---|---|---|---|
| CN | 102243445 | A | | 11/2011 | |
| CN | 206889981 | U | | 1/2018 | |
| CN | 208283723 | U | | 12/2018 | |
| CN | 208351248 | U | * | 1/2019 | |
| CN | 105723608 | B | * | 4/2019 | .............. H02N 2/06 |
| KR | 20090072985 | A | | 7/2009 | |
| TW | 200731333 | A | | 8/2007 | |
| TW | 200941150 | A | | 10/2009 | |

OTHER PUBLICATIONS

Research Disclosure, Kenneth Mason Publications , Hampshire, UK, GB, vol. 565, No. 59, May 1, 2011, p. 615, XP007140550.

* cited by examiner

400

400.1

400.2

400.3

400.31

400.3

X

Y

500

INTERFACE PLATE, INSPECTION SYSTEM AND METHOD OF INSTALLING AN INSPECTION SYSTEM

CROSS-REFERENCE TO RELATED APPLICATIONS

This application claims priority to International Application No. PCT/EP2021/057640, filed Mar. 24, 2021, and published as WO 2021/191311 A1, which claims priority of U.S. application 63/000,970 which was filed on Mar. 27, 2020. The contents of these applications are incorporated herein by reference in their entireties.

BACKGROUND

Technical Field

The present disclosure relates to mounting arrangements and methods for apparatuses such as inspection apparatuses, lithographic apparatuses and the like.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The radiation beam as typically applied in lithographic apparatuses may e.g. be a DUV radiation beam (e.g. having a wavelength of 248 nm or 193 nm) or an EUV radiation beam (e.g. having a wavelength of 11 nm or 13.5 nm).

The manufacturing of an integrated circuit may typically require the stacking of a plurality of layers, whereby the layers need to be accurately aligned. Without such an alignment, a required connection between layers may be flawed, resulting in a malfunctioning of the integrated circuit.

Typically, the bottom layer or layers of the integrated circuit will contain the smallest structures, such as transistors or components thereof. The structures of subsequent layers are typically larger and enable connections of the structures in the bottom layers to the outside world. In view of this, an alignment of two layers will be the most challenging in the bottom portion of the integrated circuit.

In order to ensure that a circuit or a circuit layer is properly patterned, substrates are often subjected to inspection, using inspection tools such as e-beam inspection tools.

Such tools may e.g. be applied to assess whether or not certain process steps, as. e.g. performed by a lithographic apparatus, are executed as expected.

At present, the mounting and installation of such high precision apparatuses such as inspection tools or apparatuses or lithographic apparatuses may be cumbersome.

SUMMARY

It is desirable to improve or facilitate the installation of apparatuses such as inspection apparatuses or lithographic apparatuses in a factory or fab. In order to address these concerns, according to an aspect of the disclosure, there is provided an interface plate for mounting an apparatus or an assembly of an apparatus to a floor or floor plate, the interface plate comprising:

an install block having an install surface configured to receive an interface surface of the apparatus or assembly, an adjustment mechanism configured to adjust a position or orientation of the install block relative to the floor or floor plate;

a mounting mechanism configured to rigidly mount the install block to the floor or floor plate.

According to another aspect of the disclosure, there is provided an inspection system comprising an inspection apparatus and a plurality of interface plates according to the disclosure, the plurality of interface plates being configured to mount the inspection apparatus or an assembly of the apparatus to the floor or floor plate.

According to yet another aspect of the disclosure, there is provided a method of installing an inspection system, the method comprising the steps of:

providing an inspection system comprising a plurality of interface plates according to the disclosure, and an inspection apparatus;

positioning the plurality of interface plates on the floor or floor plate at locations where the mounting mechanism is able to engage with the floor or floor plate;

adjusting a position or orientation of the install block relative to the floor or floor plate using the adjustment mechanism to enable alignment of the install surfaces of the install blocks to the interface surface of the inspection apparatus or assembly;

mounting the interface plates to the floor or floor plate using the mounting mechanisms;

mounting the inspection apparatus or assembly of the inspection apparatus to the interface plates.

BRIEF DESCRIPTION OF THE DRAWINGS

Embodiments of the disclosure will now be described, by way of example only, with reference to the accompanying schematic drawings in which corresponding reference symbols indicate corresponding parts, and in which.

DETAILED DESCRIPTION

The present disclosure relates to the field of installing apparatuses onto a floor. To install an apparatus onto a floor, it may be required to connect different parts of the apparatus separately onto the floor, e.g. using a large number of bolts. This may require that a large number of holes need to be drilled into the floor such that the different apparatus parts can be connected to the floor using these holes. Preparing these holes may be very time-consuming. Not only because the large number of holes but also because the location of the holes is important to ensure that the parts that need to be installed match with the holes that were drilled. In order to reduce this amount of work, some disclosed embodiments are organized such that the parts that need to be installed are no longer directly connected to the floor but are connected to so-called interface plates instead. These interface plates can be connected to the floor and the position of these plates can also be slightly adjusted. This means that location of the holes in the floor need not be as accurate as before. Once the interface plates are connected to the floor, the parts of the machine that need to be installed can be connected to the interface plates. In order to do so, the interface plates can have holes in them that match with the parts that need to be connected to them. Using the interface plates of the disclosure makes it possible to more quickly install an apparatus.

Figure 1:
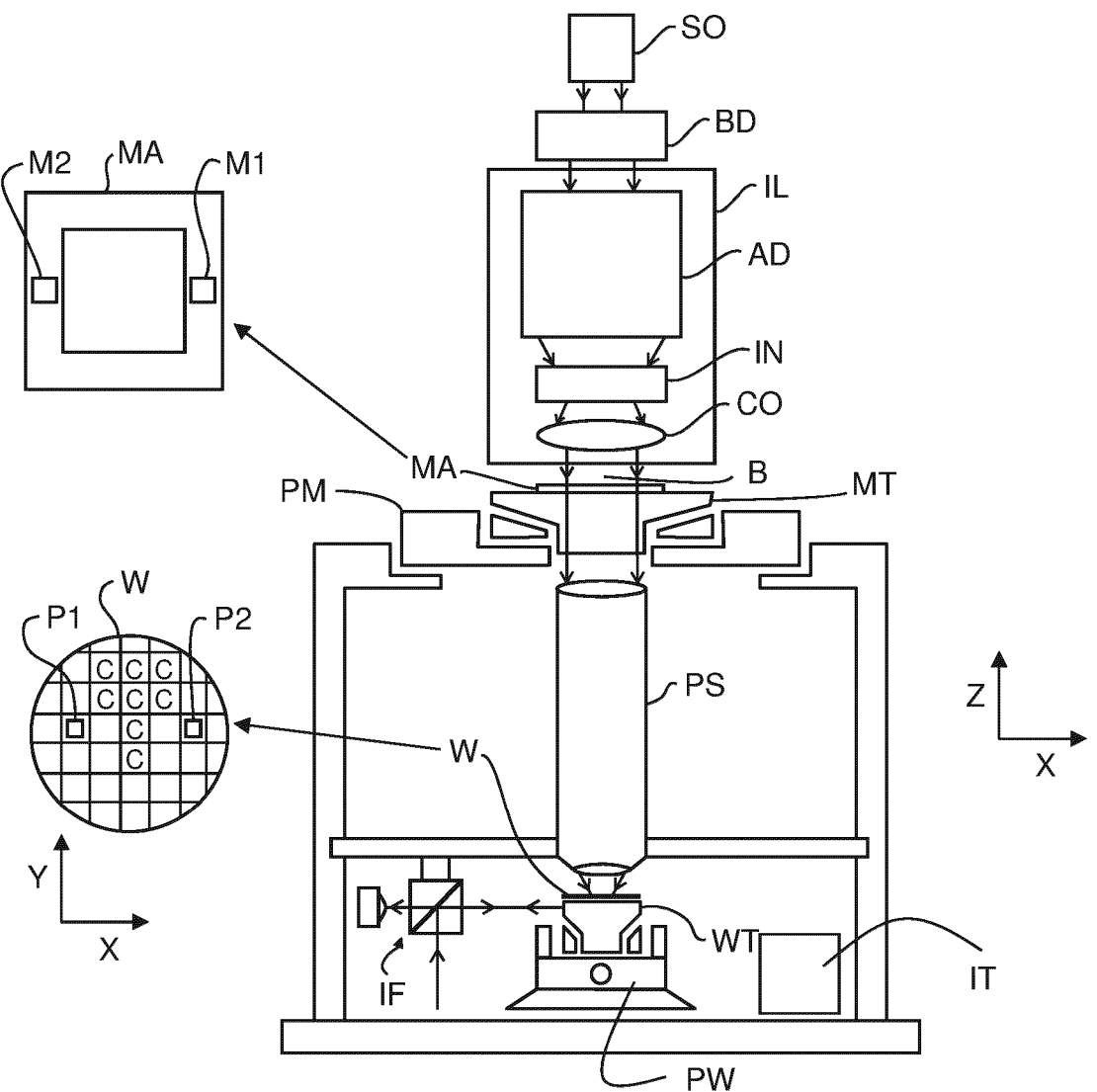
FIG. 1 depicts a lithographic apparatus according to an embodiment of the disclosure.

FIG. 1 schematically depicts a lithographic apparatus according to one embodiment of the disclosure. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask)

The lithographic apparatus may be of a type having two (dual stage) or more substrate tables or "substrate supports" (or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:
  1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X or Y direction so that a different target portion C can be exposed. In step mode, the maximum size of the exposure field limits the size of the target portion C imaged in a single static exposure.
  2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
  3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations or variations on the above described modes of use or entirely different modes of use may also be employed.

In the embodiment as shown, the lithographic apparatus further comprises an inspection tool IT. Such an inspection tool IT may e.g. enable to determine a characteristic of a structure, in particular a buried structure that is present on or in an area of interest of a substrate W that is processed by the lithographic apparatus. In an embodiment, as will be discussed in more detail below, the inspection tool may comprise an electron beam source for inspecting the substrate.

In an embodiment, the second positioning device PW may be configured to position the substrate W in the operating range of the inspection tool IT. In such an embodiment, the inspection tool IT may e.g. be configured to determine a characteristic of the mentioned structure, e.g. an electric characteristic, a material characteristic or a geometric characteristic. In an embodiment, this information may subsequently be provided to a control unit of the lithographic apparatus and used during the exposure process, e.g. by controlling one or more of the illumination system, the projection system or one of the positioning devices, based on the information.

Alternatively, an inspection tool or system IT can be a stand-alone apparatus.

In the embodiment as shown, the lithographic apparatus may be configured to apply DUV radiation for the radiation beam. In such case, the patterning device MA may be a transmissive patterning device and the projection system PS may comprise one or more lenses.

Alternatively, the lithographic apparatus according to the disclosed embodiment may be configured to apply EUV radiation for the radiation beam. In such case, the patterning device MA may be a reflective patterning device and the projection system PS may comprise one or more mirrors. In such embodiment, the apparatus may comprise one or more vacuum chambers for housing the illumination system IL or the projection system PS.

In accordance with an aspect of the present disclosure, the lithographic apparatus may comprise an inspection tool, in order to perform an inline or offline inspection of a substrate that is to be processed or has been processed.

Figure 2:
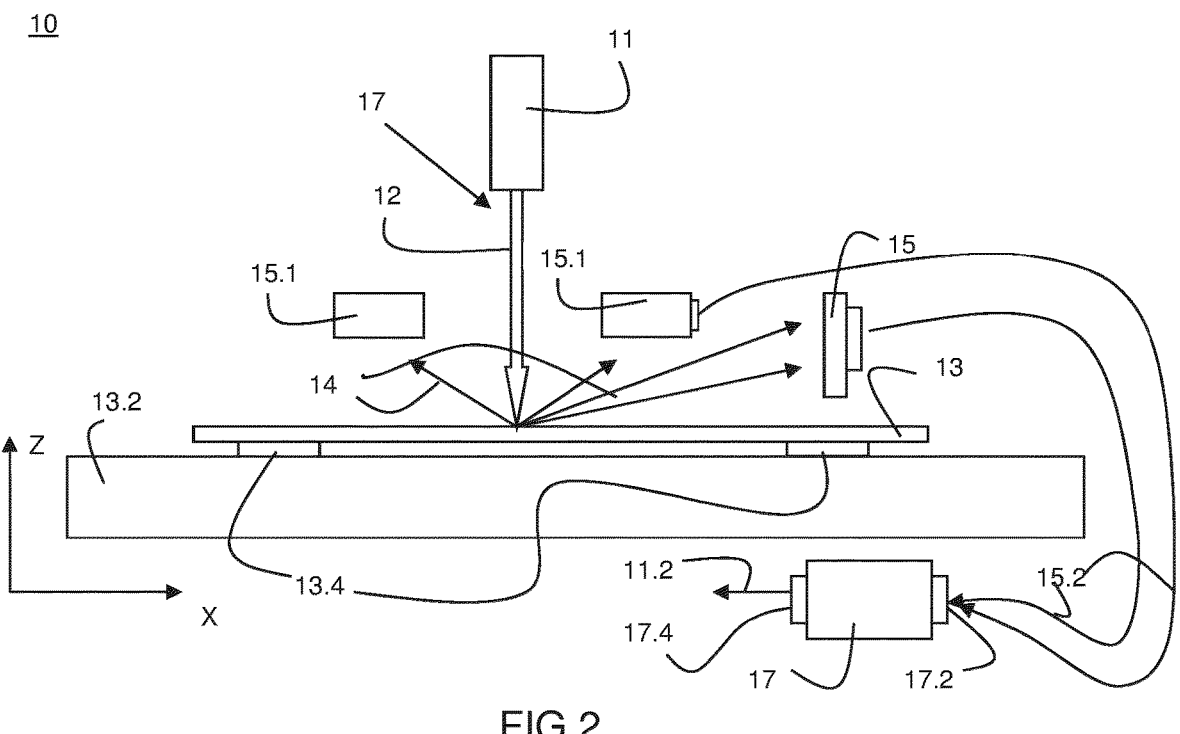
FIG. 2 depicts an inspection tool according to an embodiment of the disclosure.

According to an aspect of the disclosure, there is provided an inspection tool configured to inspect an object such as a semiconductor substrate. FIG. 2 schematically shows an embodiment of such an inspection tool 10. In accordance with the disclosed embodiment, the inspection tool 10 comprises an electron beam source 11, also referred to as an e-beam source 11.

Such an e-beam source 11 is known in general, and may be applied to project an electron beam 12 onto an area of an object 13, e.g. a substrate. In the embodiment as shown, the object 13 is mounted to an object table 13.2 by means of a clamping mechanism 13.4, e.g. a vacuum clamp or an electrostatic clamp. The area of the object onto which the e-beam is projected may also be referred to as a sample. Such an e-beam source 11 may e.g. be used to generate an electron beam 12 having an energy ranging from 0.2 keV to 100 keV. An e-beam source 11 may typically have one or more lenses for focusing the electron beam 12 onto a spot of about 0.4 to 5 nm in diameter. In an embodiment, the e-beam source 11 may further comprise one or more scanning coils or deflector plates which may deflect the electron beam 12. By doing so, the electron beam 12 may e.g. be deflected along an X-axis and an Y-axis (perpendicular to the X-axis and the Z-axis), the XY-plane being parallel to a surface of the object, such that an area of the object can be scanned.

In an embodiment, the electron beam source is configured to project a plurality of electron beams onto a respective plurality of sub-areas of the area of interest. By doing so, the area of interest that can be examined or inspected per unit of time may be enlarged. Further, in an embodiment, the electron beam source may be configured to generate electron beams having a different energy level. As will be explained in more detail below, depending on the applied energy level for the e-beam or beams, different portions of a structure, e.g. a buried structure, may be examined.

When such an e-beam 12 impinges on the surface, interactions on the surface and interactions with the material below the surface will occur, resulting in the exposed surface emitting both radiation and electrons. Typically, when an electron beam 12 interacts with a sample, the electrons constituting the beam will lose energy through scattering and absorption, within a teardrop-shaped volume, known as the interaction volume. The energy exchange between the electron beam and the sample will typically result in a combination of:

an emission of secondary electrons by inelastic scattering,
an emission of electrons that are reflected or back-scat-
tered out of the interaction volume by elastic scattering
interactions with the sample,
X-ray emission, and
an emission of electromagnetic radiation, e.g. in a range
from deep UV to IR.
The latter emission of electromagnetic radiation is generally referred to as cathodoluminescent light or CL-light.

In an embodiment, the inspection tool 10 further comprises a detector 15 for detection of secondary electrons and a detector 15.1 for back-scattering electrons as emitted by a sample. In FIG. 2, the arrows 14 are indicative for the emitted secondary or back-scattering electrons.

In the embodiment as shown, the inspection tool further comprises a control unit 17 or processing unit, e.g. comprising a microprocessor, computer or the like, for processing the emitted secondary or back-scattering electrons as detected by the detectors 15 and 15.1.

In an embodiment, the control unit 17 comprises an input terminal 17.2 for receiving signals 15.2 from the detectors 15, 15.1, the signals 15.2 representing the detected emitted secondary or back-scattering electrons.

In an embodiment, the control unit may further have an output terminal 17.4 for outputting a control signal 11.2 for controlling the e-beam source 11. In an embodiment, the control unit 17 may control the e-beam source 11 to project an e-beam 12 onto an area of interest of the object to be inspected, e.g. a semiconductor substrate.

In an embodiment, the control unit 17 may be configured to control the e-beam source 11 to scan the area of interest.

During such scanning of an area of interest of an object, the detector may receive secondary or back-scattering electrons 14 from different portions of the area of interest. As an example, the applied e-beam may e.g. have a cross-section of 1-4 nm in diameter, while the area of interest is 100 nm×100 nm. As such, when the area of interest has been scanned, a response to the e-beam across the area of interest may have been captured by detectors 15, 15.1, where the detected signal is comprised of detected electrons per illuminated pixel. The pixel size may be e.g. be smaller or larger than the cross-section of the e-beam.

Figure 3A:
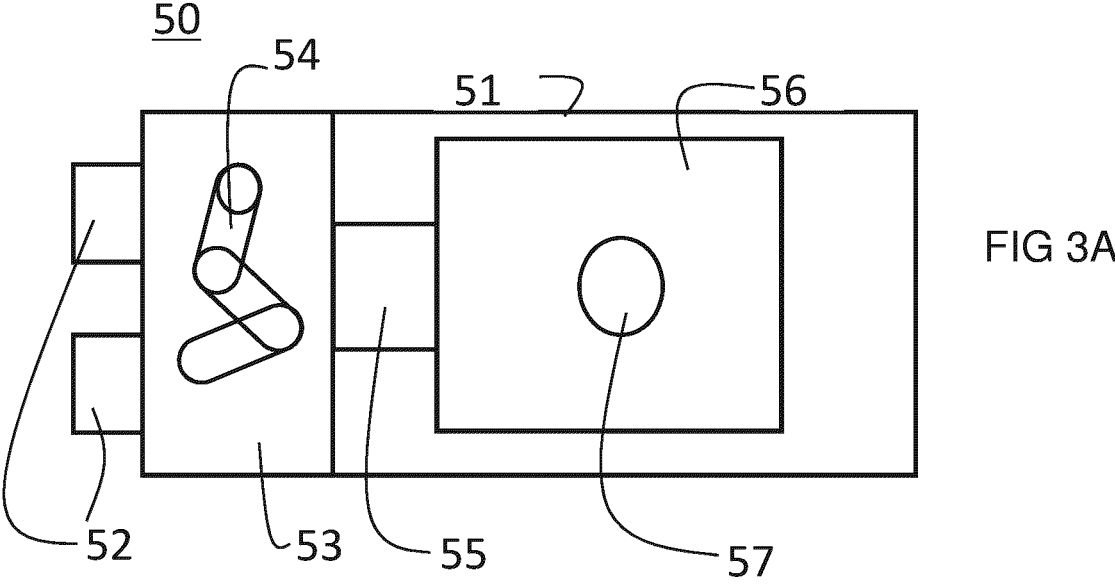
FIGS. 3A and 3B schematically depicts a top view and a side view of an inspection tool according to the present disclosure.
Figure 3B:
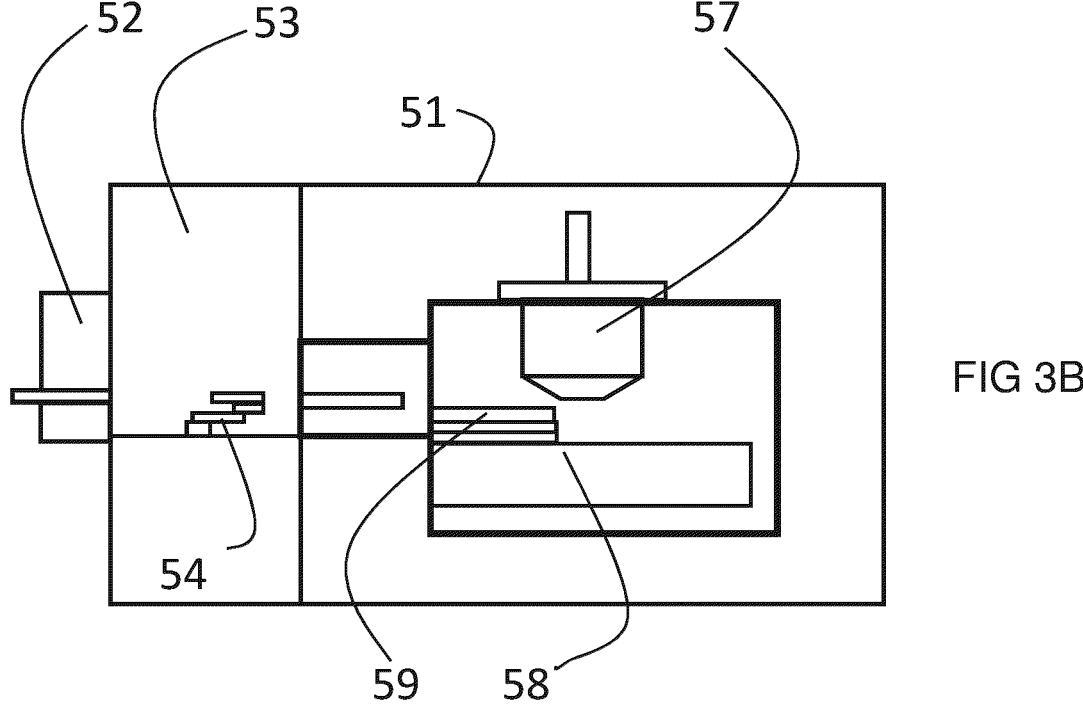

FIGS. 3A and 3B schematically depict a top view and a cross-sectional view of an inspection tool 50 according to an embodiment of the present disclosure. The embodiment as shown comprises an enclosure 51, a pair of load ports 52 serving as an interface to receive objects to be examined and to output objects that have been examined. The embodiment as shown further comprises an object transfer system, referred as an EFEM, equipment front end module 53, that is configured to handle or transport the objects to and from the load ports. In the embodiment as shown, the EFEM 53 comprises a handler robot 54 configured to transport objects between the load ports and a load lock 55 of the EBI system 50. The load lock 55 is an interface between atmospheric conditions occurring outside the enclosure 51 and in the EFEM and the vacuum conditions occurring in a vacuum chamber 56 of the inspection tool 50. In the embodiment as shown, the vacuum chamber 56 comprises an electron optics system 57 configured to project an e-beam onto an object to be inspected, e.g. a semiconductor substrate or wafer. The inspection tool 50 further comprises a positioning device 58 that is configured to displace the object 59 relative to the e-beam generated by the electron optics system 57.

In an embodiment, the positioning device may comprise a cascaded arrangement of multiple positioners, such as an XY-stage for positioning the object in a substantially horizontal plane, and a Z-stage for positioning the object in the vertical direction.

In an embodiment, the positioning device may comprise a combination of a coarse positioner, configured to provide a coarse positioning of the object over comparatively large distances, and a fine positioner, configured to provide a fine positioning of the object over comparatively small distances.

In an embodiment, the positioning device 58 further comprises an object table for holding the object during the inspection process performed by the inspection tool 50. In such embodiment, the object 59 may be clamped onto the object table by means of a clamp such as an electrostatic clamp. Such a clamp may be integrated in the object table.

Some embodiments of the disclosed system involve the mounting or installation of an apparatus such as an inspection apparatus or even a lithographic apparatus or the like. Typically, the mounting or installation of an apparatus such as an inspection apparatus involves a secure mounting of one or more components or assemblies of the apparatus onto a floor, e.g. a floor inside a fab. Typically, machines or apparatuses are installed on a floor by means of multiple adjustable feet of the apparatus. The feet are made adjustable in order to accommodate for tolerances of the floor of the fab. Once the machine is mounted to the floor, it can be locked to the floor with anchors to protect it from vibrations, e.g. caused by earth quake shocks. Rather than mounting the assembly or assemblies directly onto the floor, in accordance with the disclosed system, use is made of pre-install plates that serve as an interface between the fab floor and the machine that is to be installed. The disclosed system is particularly advantageous for the installation of machines or apparatuses which require the installation of two or more assemblies or frames or modules in a separate or disconnected manner. Such two assemblies can e.g. include a base frame for supporting an inspection tool and a stage module supporting a stage assembly configured to support an object.

Figure 4A:
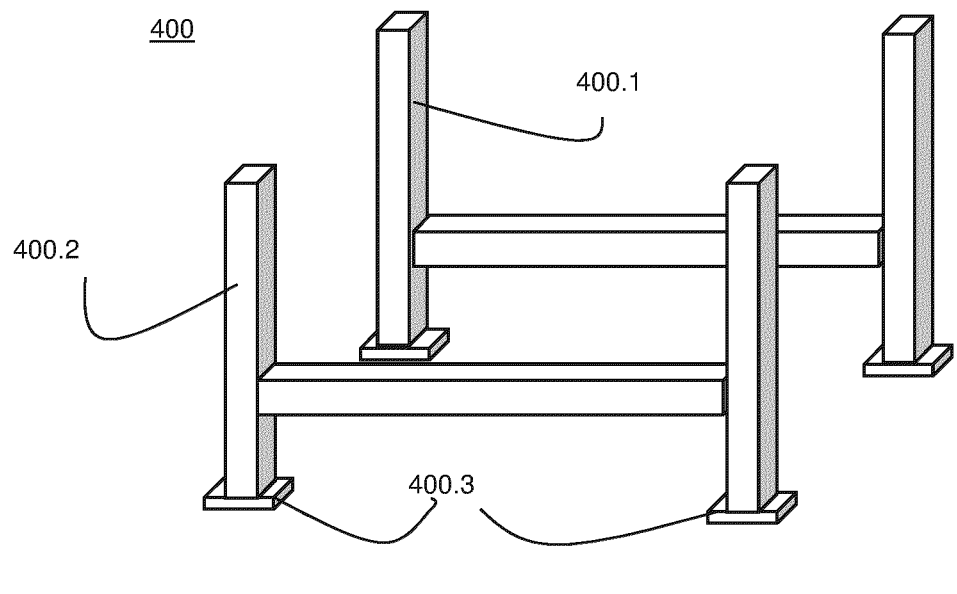
FIGS. 4A to 4C schematically shows a frame which can be used for supporting an inspection tool of an inspection apparatus.

FIG. 4*a* schematically shows a plan view of a frame 400 that can be used to support an inspection tool or the like. The frame 400 may thus be considered part of an apparatus such as an inspection apparatus for inspection objects such as semiconductor substrates or patterning devices.

The frame 400 as schematically shown comprises two H-shaped members 400.1, 400.2, each H-shaped member 400.1, 400.2 comprising a pair of feet 400.3 serving to mount the H-shaped members to a floor or floor plate or pedestal.

Figure 4B:
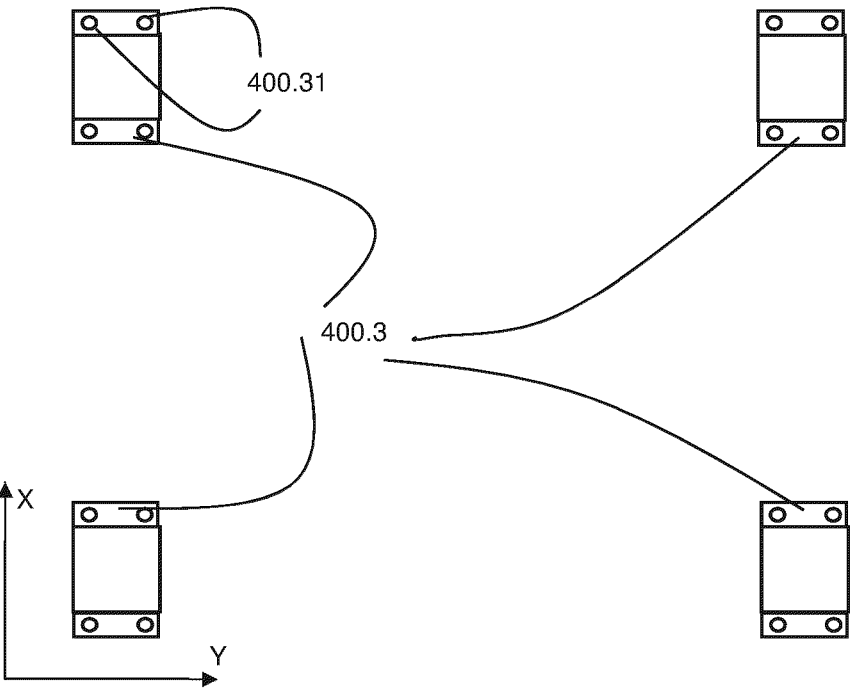
Figure 4C:
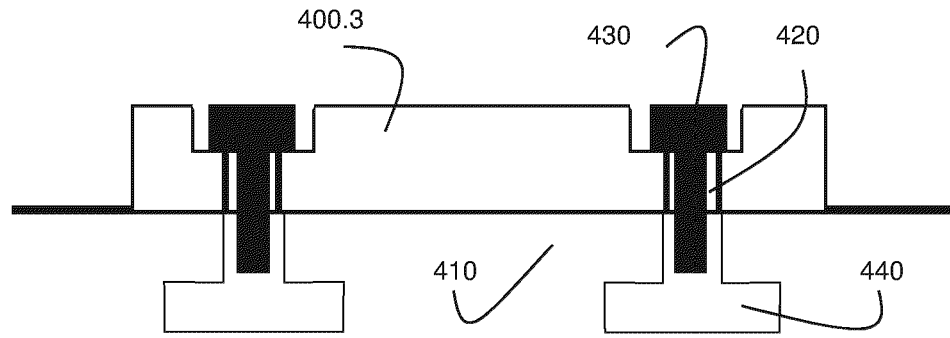

FIGS. 4*b* and 4*c* schematically illustrate a known manner of mounting a frame such as frame 400 to a floor or floor plate.

FIG. 4*b* schematically shows a top view of the feet 400.3 of the frame 400 when arranged on the floor or floor plate. As can be seen, each of the feet 400.3 is provided with 4 holes 400.31 through which bolts can be inserted for mounting the frame 400 to the floor.

In general, the mounting of the frame 400 to the floor should be sufficiently strong to withstand seismic disturbances such as earth quakes or shocks. In order to ensure a sufficiently strong connection the bolts as applied to mount the frame 400 to the floor can be configured to engage with anchors that are embedded in the floor or floor plate.

FIG. 4*c* schematically shows a cross-sectional view of a foot 400.3 of a frame 400 when mounted to a floor 410. As can be seen, the foot 400.3 is mounted to the floor 410 by bolting the foot 400.3 to the floor 410. In order to do so, the foot 400.3 is provided with through holes 420 through which bolts 430 can be inserted, said bolts 430 being configured to engage with the floor 410. In the arrangement as shown, the bolts 430 are configured to engage with seismic anchors 440 that are embedded in the floor and are provided with holes to receive the bolts 430.

Figure 5A:
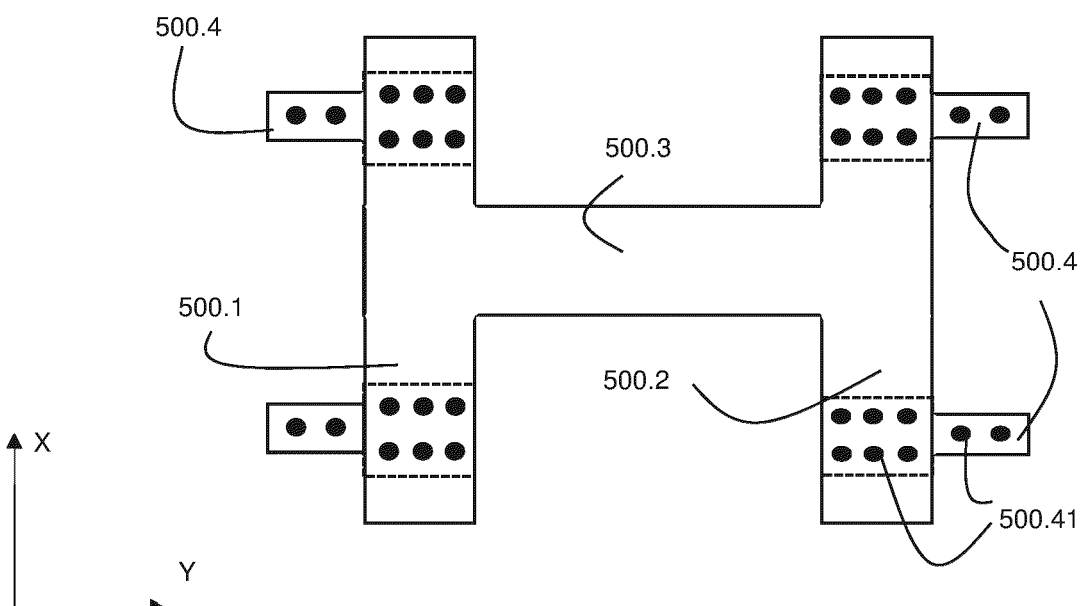
FIGS. 5A to 5B schematically shows a frame which can be used to support a stage apparatus of an inspection apparatus.
Figure 5B:
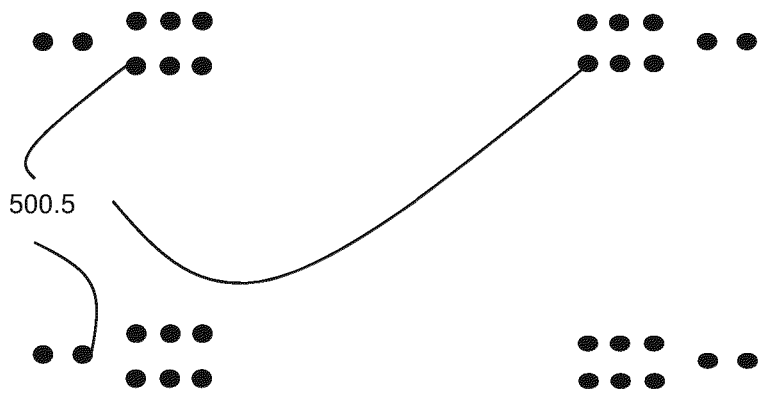

FIGS. 5*a* and 5*b* schematically respectively show a top view of a frame 500 and a top view of the floor interface for mounting the frame 500 to the floor.

The frame 500 as schematically shown comprises two horizontal beams 500.1, 500.2 extending in the X-direction and a horizontal beam 500.3 extending in the Y-direction.

The frame 500 is configured to be mounted to the floor via 4 feet 500.4, each foot having 8 holes 500.41 for securing bolts to a floor or floor plate.

FIG. 5*b* schematically shows the floor interface required for the mounting of the frame 500 to the floor. As can be seen, the mounting of the frame 500 requires that 4×8=32 holes 500.5 are provided for the mounting of the 4 feet 500.4 of the frame 500 to the floor or floor plate.

With respect to the installation of known apparatuses such as known inspection apparatuses onto to a floor such as a fab floor, it can be pointed out that such installation may require the separate installation of different assemblies or units of the apparatus. In this respect, it can be pointed out that an inspection apparatus or the like may include different components that operate together to obtain a desired performance of the apparatus, e.g. a desired yield or accuracy or throughput. In order to obtain this desired performance, it is often required to ensure that the operation of one component does not adversely affect the operation of another component of the apparatus.

In case an apparatus having multiple assemblies, e.g. a first assembly and a second assembly, is to be mounted to the floor such that the assemblies are mounted separately or independently to the floor, the following drawbacks may occur.

The time to install the apparatus may be considerable when considering that each of the assemblies may need to be mounted to the floor with multiple feet. In case of two assemblies, it would require the mounting of the first assembly to the floor with e.g. 4 feet or interfaces to the floor and the mounting of the second assembly to the floor with e.g. 4 feet or interfaces. The mounting of each interface or foot to the floor would typically require the drilling of multiple holes in the floor, or floor plate or pedestal onto which the interface or foot is to be mounted. Each interface to the floor may have stringent requirements with respect to position and tilt accuracy and needs to be sufficiently strong to withstand seismic vibrations.

It may further occur that some of the holes that need to be provided in the floor or floor plate are positioned close together. In case the floor plate or pedestal is made from concrete, it may be cumbersome to provide all required holes in the concrete without damaging it.

As an example of an apparatus that requires the separate installation of two frames or assemblies, reference can e.g. be made to an inspection apparatus, e.g. an inspection apparatus for inspecting semiconductor components such as substrates or semiconductor tools such as reticles or patterning devices. Such an apparatus may e.g. comprise a first assembly, e.g. referred to as the inspection assembly, and a second assembly, e.g. referred to as the stage assembly, which need to be mounted independently, to obtain the desired dynamic performance of the apparatus. This can be understood as follows: in an inspection apparatus having an inspection assembly and a stage assembly, the inspection assembly may e.g. comprise an inspection tool configured to inspect an object using one or more inspection beams, such as electron beams. Such an inspection tool can e.g. be mounted to a frame via vibration isolator in order to ensure that the inspection tool is not affected by vibrations such as floor vibrations or the like. The inspection apparatus further comprises a stage assembly that is configured to displace and position the object that is to be inspected relative to the inspection tool. Such a displacement and positioning of the object by the stage apparatus may also be considered a cause of vibrations. In order to avoid that these vibrations adversely affect the operation of the inspection tool, the stage apparatus needs to be isolated from the inspection tool as well. In order to achieve this, it may be preferred to separately mount the stage apparatus, or a base frame thereof, on the floor, rather than having a common frame for the stage apparatus and the inspection tool. In the latter case, such a common frame would require a comparatively large and heavy frame, in order for the frame to be sufficiently stiff, such that vibrations of the stage apparatus are not disturbing the inspection tool.

Figure 6:
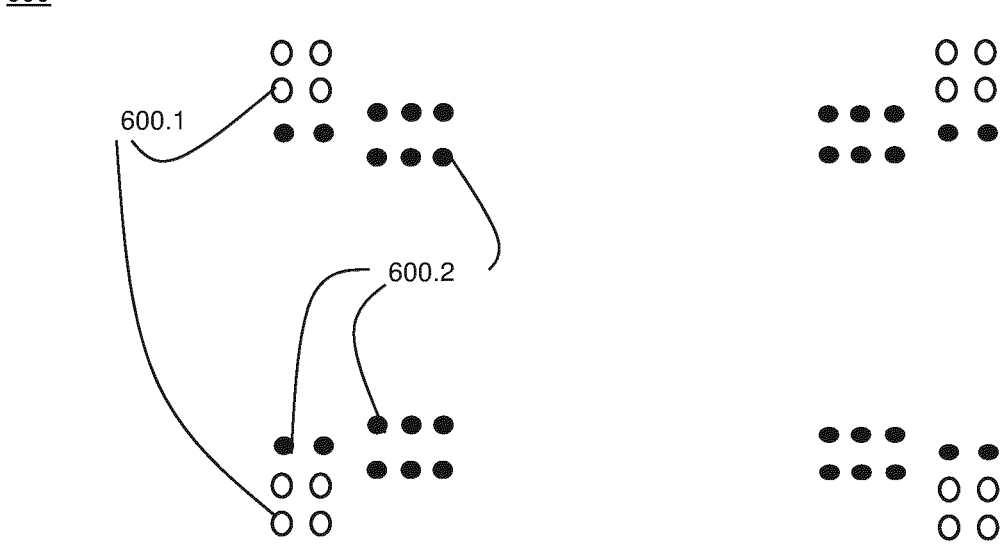
FIG. 6 schematically shows the required interfaces for mounting the frames of FIGS. 4 and 5 to a floor.

FIG. 6 schematically illustrates the required floor interface in case two frames such as frames 400 and 500 need to be mounted onto a fab floor or floor plate. As can be seen, the mounting of the frames 400 and 500 to the floor via their respective feet 400.3 and 500.4 would require that in total 4×4+4×8=48 holes 600 need to be provided for the mounting of the frames 400 and 500. In the arrangement as shown, the holes 600.1 represent the holes required for the mounting of the feet 400.3 of the frame 400 as shown above. These holes are thus to be aligned with the holes 400.31 of the feet 400.3 of the frame 400. Holes 600.2 represent the holes that are to be aligned with the holes 500.41 of the feet 500.4 of the frame 500. As will be acknowledged by the skilled person, it may be time-consuming to provide all the required holes at the appropriate locations, with the required accuracy.

In order to alleviate or mitigate this effort, the present disclosure provides an alternative manner of mounting frames or assemblies to a floor or floor plate.

In the present disclosure, use is made of interface plates or interface members that can be installed onto the floor, floor plate or pedestal, prior to the installation of the apparatus. In accordance with the present disclosure, the interface plates or members are designed to receive the assembly or assemblies of the apparatus that needs to be installed.

In accordance with the present disclosure, the position and orientation of the surface of the interface plates or members that are to receive the assembly can be adjusted, in order to take account of any tolerances of the floor or mounting tolerances of the anchoring of the interface plates to the floor.

In accordance with the present disclosure, the interface plates comprise an install block, one or more adjustment mechanisms and one or more mounting mechanisms. In particular, in accordance with the present disclosure, an interface plate for mounting an apparatus or an assembly of an apparatus to a floor or floor plate is provided that comprises an install block having an install surface that is configured to receive an interface surface of the apparatus or assembly that is to be installed. The interface plate further comprises an adjustment mechanism configured to adjust a position or orientation of the install block relative to the floor or floor plate. In some embodiments, the adjustment mechanism allows for adjusting the interface plate in any of x, y, z, Rx, Ry, or Rz to facilitate a precise alignment with the apparatus or assembly. The interface plate according to the disclosure further comprises a mounting mechanism configured to rigidly mount the install block to the floor or floor plate.

Figure 7:
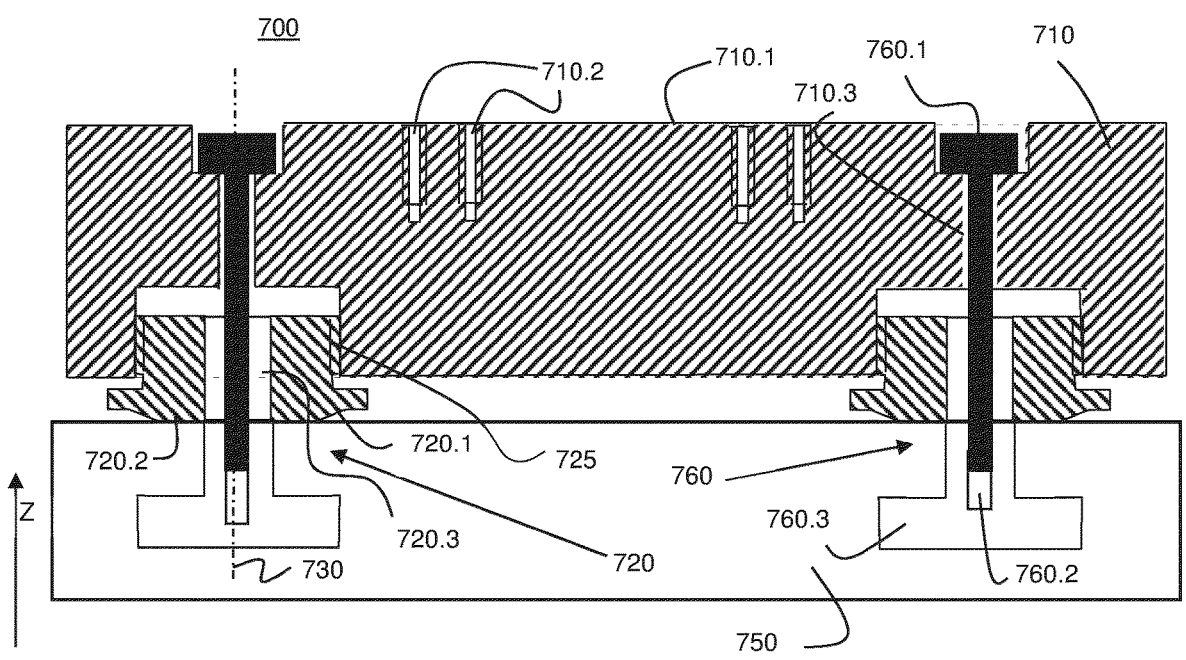
FIG. 7 schematically shows a cross-section of an interface plate according to an embodiment of the present disclosure.

FIG. 7 schematically shows an embodiment of an interface plate 700 according to the disclosure.

Interface plate 700 as schematically shown comprises an install block 710 having an install surface 710.1 that is configured to receive an interface surface of the apparatus or assembly that is to be installed. In the embodiment as shown, the install block comprises a plurality of mounting holes 710.2.

The interface plate 700 as schematically shown further comprises an adjustment mechanism 720 that is configured to adjust a position or orientation of the install block relative to the floor or floor plate 750. In particular, the adjustment mechanism 720 comprises an adjustment member 720.1 that provides a support for the install block 710 on the floor or floor plate 750. In particular, a bottom surface 720.2 of the adjustment member 720.1 is configured to be mounted on the floor or floor plate 750. In the embodiment as shown, the adjustment member 720.1 is connected to the install block 710 via a threaded connection 725, said threaded connection 725 enabling a relative displacement of the bottom surface 720.2 of the mechanism 720 and the install surface 710.1 in a vertical direction, i.e. the indicated Z-direction. In particular, by rotating the member 720.1 about the axis 730, the bottom surface 720.1 of the adjustment mechanism 720 will displace along the Z-direction.

The application of a plurality of such adjustment mechanism 720 in an interface plate 700 according to the present disclosure would allow to adjust a relative position or orientation of the install surface of the install block relative to the floor or floor plate 750.

In the embodiment as shown, the interface plate 700 further comprises a mounting mechanism 760 for mounting the install block 710 to the floor or floor plate 750. The mounting mechanism comprises a bolt 760.1 for bolting the install block to the floor or floor plate 750. In particular, the bolt 760.1 is configured to be anchored to the floor or floor plate 750 via the through hole 710.3 of the install block 710. In the embodiment as shown, the through hole 710.3 of the install block 710 is aligned with a through hole 720.3 of the adjustment mechanism 720. From a functional point of view, both through holes 710.3 and 720.3 should provide a minimal radial clearance, i.e. a clearance to enable the positioning of the install block 710 in the horizontal plane to its desired location.

By doing so, the anchoring of the install block 710 to the floor 750 can be realized without exerting a substantial torque on the install block 710. It should however not be excluded that the mounting mechanism 760 and the adjustment mechanism 720 as applied in the present disclosure are not aligned with each other.

In the embodiment as shown, a diameter of the through hole 710.3 of the install block 710 can be selected to be larger than the diameter of the bolt 760.1. By doing so, the install block 710 can be displaced in the horizontal plane, i.e. a plane perpendicular to the indicated Z-direction. By allowing such a displacement, a horizontal position of the install block 710 can corrected for tolerances in the positions of the holes 760.2 that are provided in the floor or floor plate 750 and which are configured to receive the bolts 760.1 of the mounting mechanism 760.

In the embodiment as shown, the bolts 760.1 of the mounting mechanism 760 are configured to engage with seismic anchors 760.3 that are embedded in the floor or floor plate 750, the seismic anchors 760.3 comprising the holes 760.2 for receiving the bolts 760.1.

Figure 8:
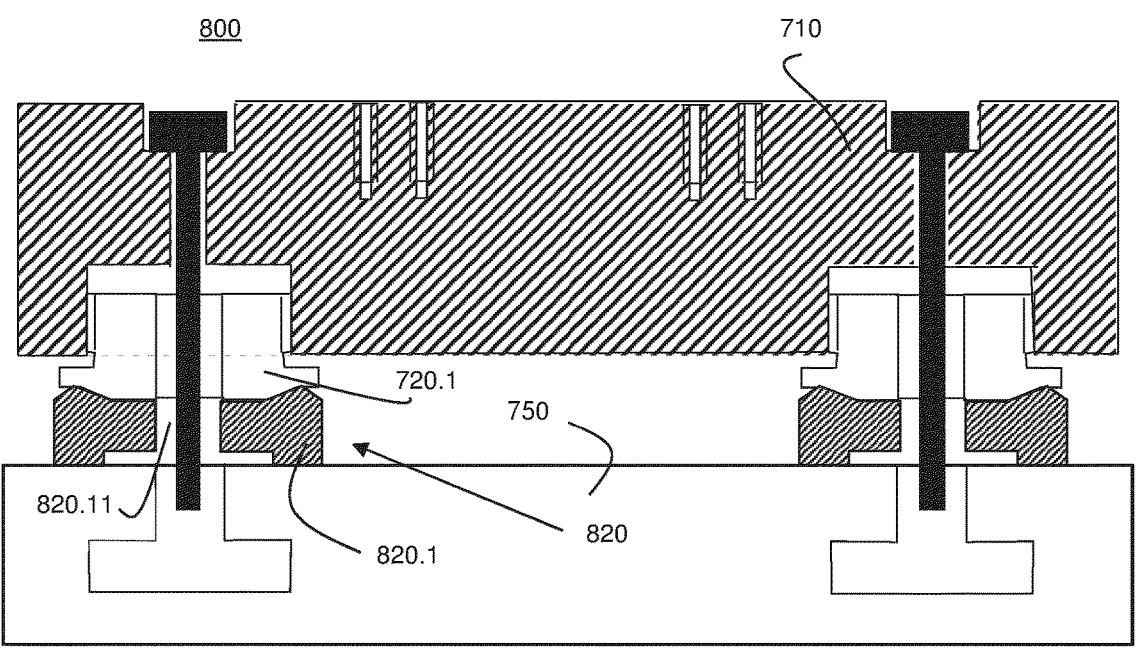
FIG. 8 schematically shows a cross-section of an interface plate according to another embodiment of the present disclosure.

In the embodiment as shown in FIG. 7, the adjustment member that is engaged with the install block 710 is directly mounted to the floor or floor plate 750. FIG. 8 schematically shows an alternative embodiment.

FIG. 8 schematically shows an interface plate 800 according to the present disclosure, the interface plate 800 is similar to the install plate 700 as shown in FIG. 7, apart from the following.

The interface plate 800 as schematically shown in FIG. 8 comprises an adjustment mechanism 820 which comprises a first adjustment member 720.1 that is configured to engage with the install block 710 of the interface plate 800. The first adjustment member 720.1 of the adjustment mechanism 820 is supported by a second adjustment member 820.1, said second adjustment member 820.1 being configured to be positioned on the floor or floor plate 750. As such, rather than directly mounting the adjustment member 720.1 onto the floor, as shown in FIG. 7, the adjustment mechanism 820 comprises a second adjustment member 820.1 that is arranged as an interface between the floor or floor plate 750 and the adjustment member 720.1.

In the embodiment as shown, the second adjustment member 820.1 comprises a through hole 820.11 through which the bolt 760.1 of the mounting mechanism 760 can be inserted to engage with the floor or floor plate 750. The additional member 820.1 allows for local tilts of the floor or floor plate onto which the interface plate 800 is mounted. In an embodiment, the contact between the adjustment member 720.1 and the additional member 820.1 can be curved. In particular, the contact can be spherical to cone or spherical to spherical. In the embodiment of FIG. 7, there may, in case of a tilted floor, be only a small contact point or area at or near the highest floor location. This may have two disadvantages:

It can result in a high contact stress of the floor contact with a risk of relaxation or fractures.

It may give rise to a bending torque on the install block 710 after locking the bolts 760.1.

As such, in case of a floor or floor plate that is not flat, the use of the embodiment of FIG. 8 may be preferred.

When the install plates according to the disclosure are used, i.e. positioned and mounted to a floor or floor plate such as a floor of a fab, the upper surfaces of the install plates, in particular the upper surfaces of the install blocks of the install plates may serve as mounting surfaces for mounting a frame such as a frame of an inspection apparatus.

Figure 9:
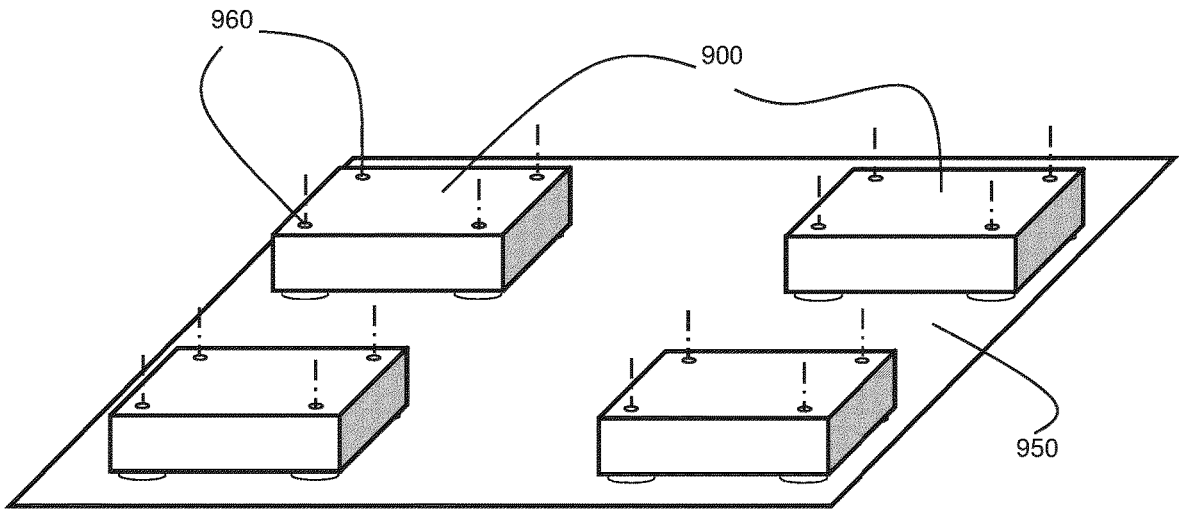
FIG. 9 schematically shows an arrangement of 4 interface plates according to the disclosure onto a floor or floor plate.

FIG. 9 schematically shows an arrangement of 4 interface plates 900 that have been positioned on a floor or floor plate 950. The interface plates 900 can be properly mounted onto the floor or floor plate 950 using the adjustment mechanisms of the interface plates 900.

In the embodiment as shown in FIG. 9, each of the interface plates 900 comprises 4 holes 960 which serve to receive mounting members, e.g. bolts such as bolts 760.1, for rigidly mounting the interface plates to the floor or floor plate 950. Note that holes for mounting a frame to the interface plates, such as holes 710.2, are not shown in FIG. 9.

As already mentioned above, the installation of certain apparatuses such as inspection apparatuses may require the installation of different frames separately onto the floor or floor plate. As illustrated in FIG. 6, this may result in the requirement of providing a large number of holes into the floor or floor plate, in order to mount the different frames. The present disclosed system facilitates the mounting of such different or multiple frames by providing interface plates according to the disclosure.

In an embodiment of the present disclosure, a system, e.g. an inspection system, that comprises multiple frames or assemblies may be mounted to the floor or floor plate in the following manner using the present disclosure.

In case the system, e.g. an inspection system, comprises a first frame that needs to be mounted to the floor and a second frame that needs to be mounted to the floor, the inspection system can e.g. comprise a first set of interface plates according to the disclosure for mounting the first frame to the floor or floor plate and a second set of interface plates for mounting the second frame to the floor or floor plate.

Figure 10:
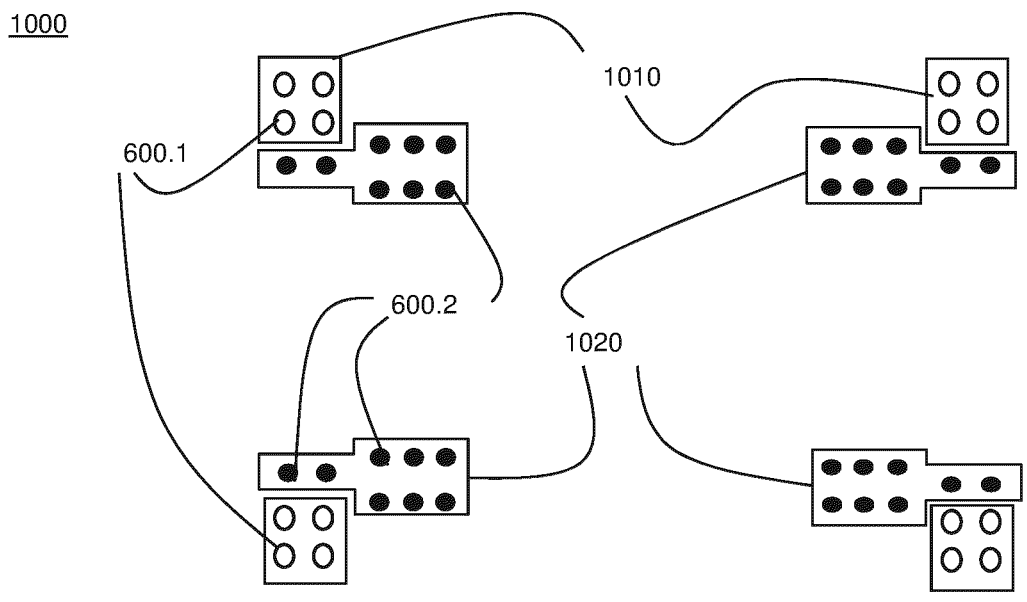
FIGS. 10 to 12 schematically show top views of interface plates according to the disclosure.

FIG. 10 schematically shows a top view of such a first set of interface plates and a second set of interface plates that are configured to be used for the mounting of two frames, in particular frames 400 and 500 as shown in FIGS. 4a and 5a. In particular, FIG. 10 schematically shows an interface arrangement 1000 comprising a first set of interface plates 1010 that are configured interface between the floor or floor plate and the first frame 400 as shown in FIG. 4a. As can be see, the interface plates 1010 are each provided with 4 holes that are to be aligned with the holes 600.1 represent the holes required for the mounting of the feet 400.3 of the frame 400 as shown above. These holes are thus to be aligned with the holes 400.31 of the feet 400.3 of the frame 400. The interface arrangement 1000 further comprising a second set of interface plates 1020 that are configured interface between the floor or floor plate and the first frame 500 as shown in FIG. 5a. The interface plates 1020 are provided with holes 600.2 representing the holes that are to be aligned with the holes 500.41 of the feet 500.4 of the frame 500.

Figure 11:
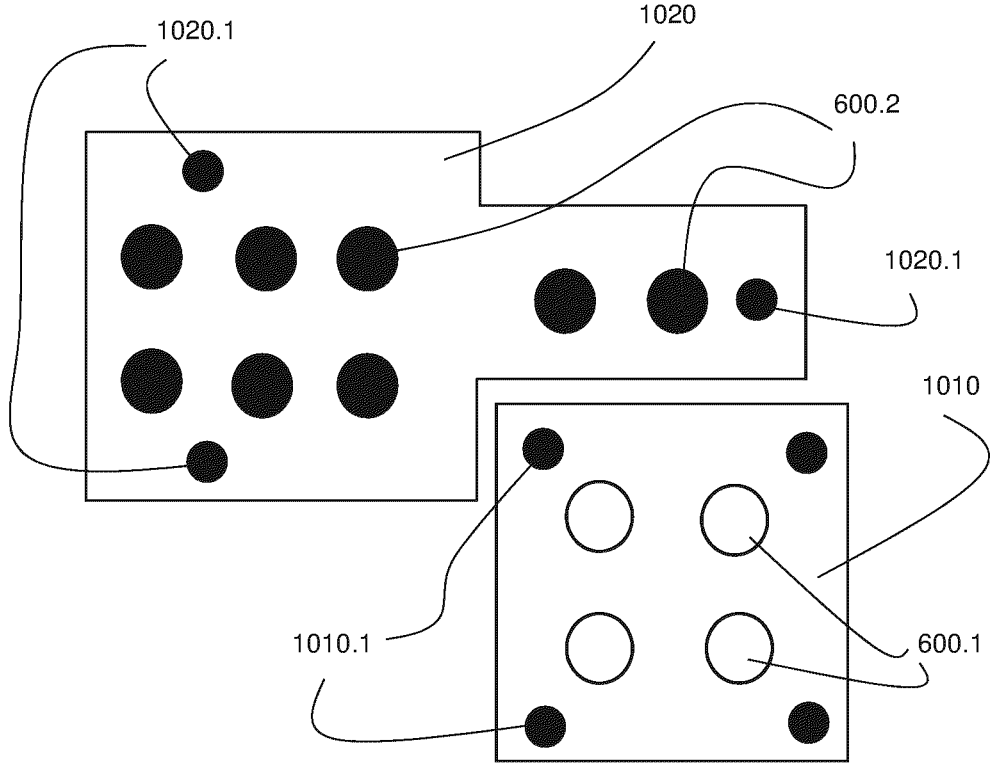

Each of the interface plates 1010 or 1020 may be configured to be mounted to the floor or floor plate with a plurality of mounting mechanisms. FIG. 11 schematically shows a more detailed to view of an interface plate 1010 and an interface plate 1020 as can be applied in the present disclosure, for the mounting of two separate frames or assemblies of an apparatus such as an inspection apparatus. The interface 1010 comprises 4 holes 600.1 configured to be mounted to a foot 400.3 of a frame 400 as shown above, the interface 1020 comprises 8 holes 600.2 representing the holes that are to be aligned with the holes 500.41 of a foot 500.4 of the frame 500. In addition, the interface plate 1010 further comprises 4 holes 1010.1 that are configured to receive bolts or mounting elements for mounting the interface plate 1010 to the floor or floor plate. Such holes can e.g. be compared to holes 710.3 of the install block 710 shown in FIG. 7. The interface plate 1020 further comprises 3 holes 1020.1 that are configured to receive bolts or mounting elements for mounting the interface plate 1020 to the floor or floor plate, e.g. in a similar manner as the mounting of the interface plate 710 to the floor 750 using mounting mechanisms 760.

The interface plates 1010 and 1020 thus comprise a first set of holes to interface with feet of the frame or assemble that is to be mounted onto the interface plate and a second set of holes to receive bolts or mounting members for mounting the interface plate to the floor.

For the interface plate 1010, the number of the first set of holes (holes 600.1) is equal to the number of the second set of holes (holes 1010.1). For the interface plate 1020, the number of the first set of holes (holes 600.2) is larger than the number of the second set of holes (holes 1020.1). In case the number of holes that interface with the frame or assembly (holes 600.1 or 600.2) is larger than the number of holes used to mount the interface plate to the floor, less holes need to be drilled into the floor for mounting the frame or frames of the apparatus that is installed. Even if a larger number or the same number of holes would be applied for mounting the interface plate to the floor or floor plate, the use of interface plates according to the disclosure would still have the advantage that the tolerances for these holes can be more relaxed, due to the use of the adjustment mechanisms of the interface plates.

In the embodiment as shown in FIGS. 10 and 11, separate interface plates are provided for each frame or assembly that needs to be installed.

As an alternative, in an embodiment of the present disclosure, an interface plate can be devised onto which multiple frames or assemblies can be mounted. In particular, the interface plates 1010 and 1020 as schematically shown in FIG. 11 can be replaced by a single interface plate that is configured to receive both a foot 400.3 of a frame 400 as shown above and a foot 500.4 of a frame 500 shown above.

Figure 12:
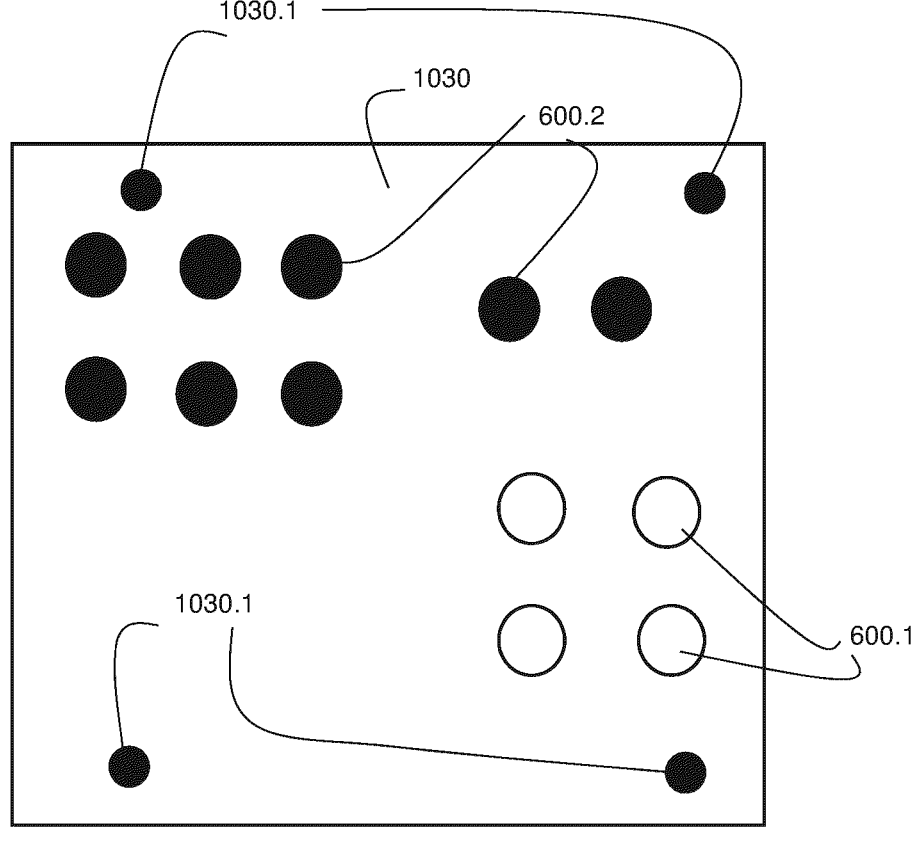

FIG. 12 schematically shows such an interface plate 1030 configured to receive multiple feet of different frames. In the embodiment as shown, the interface plate 1030 comprises a first set of holes (4 holes 600.1) configured for the mounting of a foot 400.3 of a frame 400 as shown above, a second set of holes (8 holes 600.2) representing the holes that are to be aligned with the holes 500.41 of a foot 500.4 of the frame 500 and a third set of holes (4 holes 1030.1) that are configured to receive bolts or mounting elements for mounting the interface plate 1030 to the floor or floor plate. As will be appreciated, by combining interfaces for multiple feet of multiple frames or assemblies onto a single interface plate, the number of mounting members required on the floor or floor plate can be reduced significantly. Compared to the arrangement as depicted in FIG. 6, which requires 48 holes to be provided, the required number of holes to mount 4 interface plates 1030 would only be 16. It can further be pointed out that by arranging the mounting mechanism further apart, an improved tilt stiffness can be obtained. In this respect, reference can e.g. be made to FIG. 11, where the holes 1010.1 for mounting the interface plate 1010 are spaced further apart than the holes 600.1 which serve for mounting a frame onto the interface plate 1010. In a similar manner, reference can be made to FIG. 12 where the holes 1030.1 for mounting the interface plate 1030 are spaced further apart than the holes 600.1 and 600.2 which serve for mounting the frames onto the interface plate 1030.

In an embodiment of the present disclosure, the interface plate as applied comprises 3 or more adjustment mechanisms. In such embodiment, the install surface may e.g. have a substantially triangular shape and the interface plate may e.g. comprise 3 adjustment mechanisms arranged at respective corners of the install surface. Alternatively, the install surface may e.g. have a substantially rectangular shape and the interface plate may e.g. comprise 4 adjustment mechanisms arranged at respective corners of the install surface.

It can be pointed out that interface plates with only 3 adjustment mechanism may result in a less over-constraint arrangement. The use of 4 or more adjustment mechanisms may however result in an improved stiffness.

The present disclosure facilitates the mounting or installation of apparatuses such as inspection apparatuses or the like onto a floor or floor plate. The use of interface plates according to the disclosure enables a relaxation of the required tolerances for holes that need to drilled for mounting a frame or frames of the apparatus to the floor. In an embodiment, the use of the interface plates according to the disclosure also result in a reduction of the number of holes that need to be drilled. As a result, less seismic anchors such as anchors 760.3 may be required. In an embodiment, the interface plates as used in the present disclosure are configured to receive feet of multiple different frames of the apparatus that needs to be installed. By doing so, one maintains the flexibility of designing an apparatus with multiple different frames without the need to mount each of said frames separately or individually to the floor or floor plate. By using the interface plates according to the disclosed system, the time to install an apparatus may significantly be reduced. It can also be pointed out that when last minute design changes to an apparatus or assembly or module of an apparatus may be required, the interface of the apparatus, assembly or module with the floor may change as well. Using the disclosed system, there is however no need to change the actual floor interface, i.e. the pattern of holes in the floor; it may be sufficient to modify the interface plates, in particular the mounting holes of the install blocks of the interface plates, to take account of any modifications of the frame, i.e. the interface of the apparatus with the floor.

Using the interface places according to embodiments of the disclosure, an inspection system can be installed by performing the following steps:

providing an inspection system comprising a plurality of interface plates according to the disclosure, and an inspection apparatus;

positioning the plurality of interface plates on the floor or floor plate at locations where the mounting mechanism is able to engage with the floor or floor plate;

adjusting a position or orientation of the install block relative to the floor or floor plate using the adjustment mechanism to enable alignment of the install surfaces of the install blocks to the interface surface of the inspection apparatus or assembly;

mounting the interface plates to the floor or floor plate using the mounting mechanisms;

mounting the inspection apparatus or assembly of the inspection apparatus to the interface plates.

In an embodiment, the disclosed system may be used for the installation of an inspection apparatus such as an e-beam inspection apparatus. Such an apparatus is schematically shown in FIG. 13.

Figure 13:
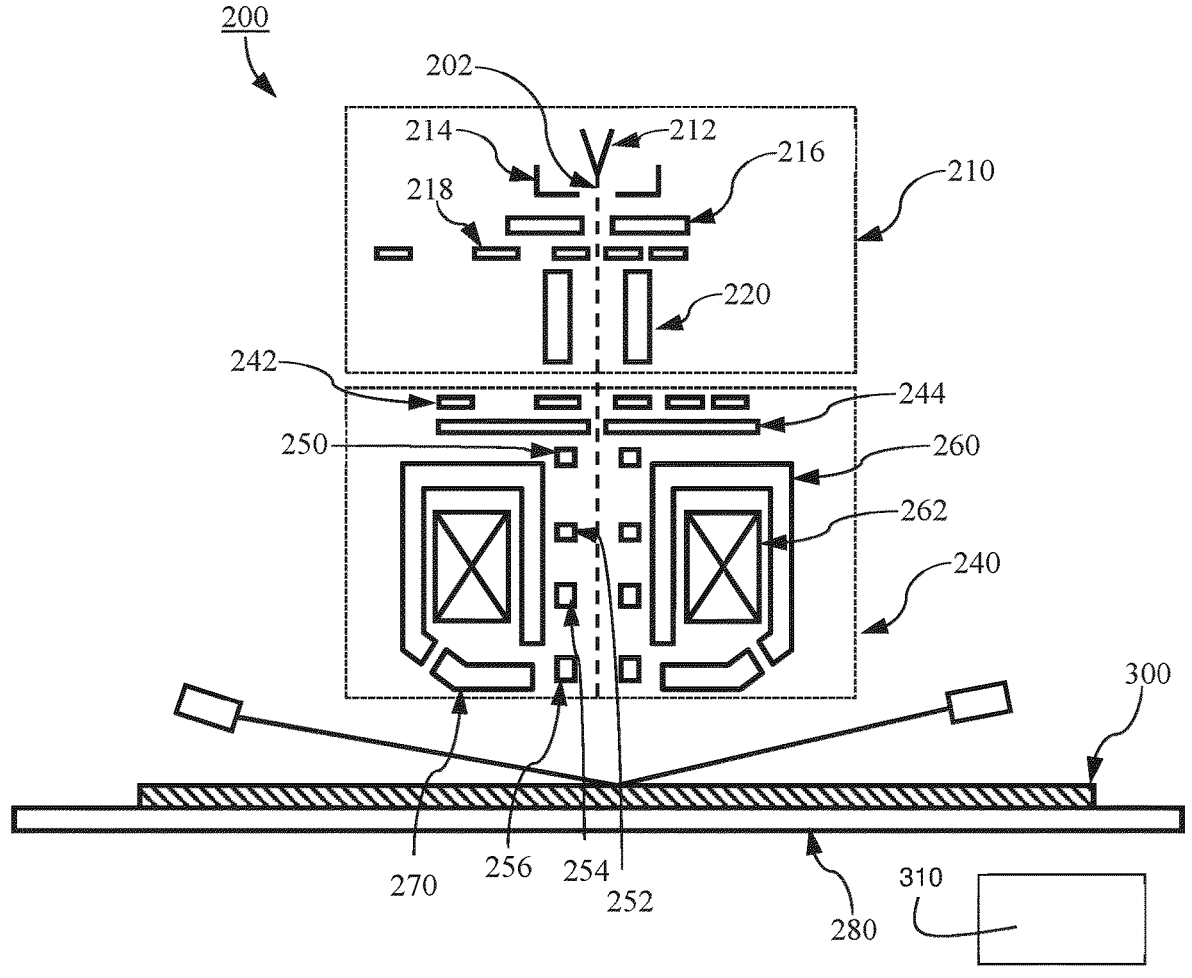
FIG. 13 schematically depicts a more detailed embodiment of an inspection tool according to the present disclosure.

FIG. 13 schematically depict a more detailed embodiment of an inspection tool 200 according to the disclosure. The inspection tool 200 comprises an e-beam source, referred to as the electron gun 210 and an imaging system 240.

The electron gun 210 comprises an electron source 212, a suppressor electrode 214, an anode 216, a set of apertures 218, and a condenser 220. The electron source 212 can be a Schottky emitter or modified Schottky emitter. By the positive charge of the anode 216, the electron beam 202 can be extracted, and the electron beam 202 may be controlled by using a tunable aperture 218 which may have different aperture sizes for eliminating the unnecessary electron beam outside of the aperture. In order to condense the electron beam 202, the condenser 220 is applied to the electron beam 202, which also provides magnification. The condenser 220 shown in the FIG. 10 may e.g. be an electrostatic lens which can condense the electron beam 202. On the other hand, the condenser 220 can be also a magnetic lens.

The imaging system 240 may e.g. comprise a blanker, a set of apertures 242, a detector 244, four sets of deflectors 250, 252, 254, and 256, a pair of coils 262, a yoke 260, and an electrode 270. The electrode 270 may be used to retard and deflect the electron beam 202, and may further have an electrostatic lens function. Besides, the coil 262 and the yoke 260 may be configured to the magnetic objective lens.

The deflectors 250 and 256 can be applied to scan the electron beam 202 to a large field of view, and the deflectors 252 and 254 can be used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct a chromatic aberration of the electron beam 202, the electrode 270, the sample 300, and the yoke 260 or part thereof may form a lens to eliminate the chromatic aberration of the electron beam 202. The inspection tool 200 further comprises a processing unit 310, which can e.g. be embodied as a processor, microprocessor, controller, or computer, the processing unit 310 being configured to receive a response signal from the detector or detectors, e.g. detector 244, of the inspection tool and process the response signal into an image of the scanned or examined structure or sample 300.

The present disclosure can also be described by the following clauses:

Clause 1. An interface plate for mounting an apparatus or an assembly of an apparatus to a floor or floor plate, the interface plate comprising:

an install block having an install surface configured to receive an interface surface of the apparatus or assembly, an adjustment mechanism configured to adjust a position or orientation of the install block relative to the floor or floor plate; and a mounting mechanism configured to rigidly mount the install block to the floor or floor plate.

Clause 2. The interface plate according to clause 1, wherein the adjustment mechanism comprises a first member configured to engage with the install block, whereby a position of a bottom surface of the first member relative to the install surface is adjustable.

Clause 3. The interface plate according to clause 2, wherein the adjustment mechanism further comprises a second member, the second member comprising a bottom surface configured to be positioned on the floor or floor plate and a top surface configured to receive the bottom surface of the first member.

Clause 4. The interface plate according to any of the clauses 1 to 3, wherein the install block is provided with a plurality of mounting holes for mounting the interface surface of the apparatus or assembly to the install surface of the install block.

Clause 5. The interface plate according to any of the preceding clauses, wherein the interface plate comprises a plurality of adjustment mechanisms.

Clause 6. The interface plate according to any of the preceding clauses referring to clause 2, wherein the first member is connected to the install block via a threaded connection, said threaded connection enabling a relative displacement of the bottom surface of the first member and the install surface in a vertical direction.

Clause 7. The interface plate according to any of the preceding clauses, wherein the mounting mechanism comprises a bolt for anchoring the install block to the floor or floor plate.

Clause 8. The interface plate according to any of the preceding clauses referring to clause 3, whereby the first member and the second member comprise a through hole extending in the vertical direction.

Clause 9. The interface plate according to clause 8, wherein the install block comprises a through hole configured to receive a bolt of the mounting mechanism, the through hole of the install block having a clearance to enable the bolt to align with a mounting hole provided in the floor or floor plate.

Clause 10. The interface plate according to any of preceding clause, wherein the install block comprises a first set of mounting holes for mounting an interface surface of a first assembly of the apparatus and a second set of mounting holes for mounting an interface surface of a second assembly of the apparatus.

Clause 11. The interface plate according to clause 10, wherein the first assembly comprises a frame of a stage assembly of an inspection apparatus and wherein the second assembly comprises a frame of an inspection tool of the inspection apparatus.

Clause 12. The interface plate according to any of the preceding clauses, wherein the adjustment mechanism is configured to adjust a position of the install block relative to the floor or floor plate in 3 translational degrees of freedom.

Clause 13. The interface plate according to any of the preceding clauses, wherein the interface plate comprises 3 or more adjustment mechanisms.

Clause 14. The interface plate according to clauses 13, wherein the install surface has a substantially triangular shape and wherein the interface plate comprises 3 adjustment mechanisms arranged at respective corners of the install surface.

Clause 15. The interface plate according to clause 13, wherein the install surface has a substantially rectangular shape and wherein the interface plate comprises 4 adjustment mechanisms arranged at respective corners of the install surface.

Clause 16. The interface plate according to any of the clauses 13 to 15, wherein the adjustment mechanisms are configured to adjust a position of the install block relative to the floor or floor plate in 3 translational degrees of freedom and 3 rotational degrees of freedom.

Clause 17. The interface plate according to clause 15, wherein the install block comprises 4 through holes configured to receive respective 4 bolts of the mounting mechanisms, the through holes of the install block being configured to having a clearance to enable the 4 bolts to align with mounting holes provided in the floor or floor plate.

Clause 18. The interface plate according to any of the preceding clauses, wherein the install block comprises a first set of mounting holes for mounting an interface surface of a first assembly of the apparatus, the number of mounting holes of the first set being larger than 3.

Clause 19. The interface plate according to any of the preceding clauses, wherein the install block comprises a first set of mounting holes for mounting an interface surface of a first assembly of the apparatus and a second set of mounting holes for mounting an interface surface of a second assembly of the apparatus, the number of mounting holes of the first set plus the number of mounting holes of the second set being larger than 4.

Clause 20. An inspection system comprising an inspection apparatus and a plurality of interface plates according to any of the preceding clauses, the plurality of interface plates being configured to mount the inspection apparatus or an assembly of the apparatus to the floor or floor plate.

Clause 21. The inspection system according to clause 20, wherein the plurality of interface plates comprises a first set of interface plates for mounting a first assembly of the inspection apparatus to the floor or floor plate and a second set of interface plates for mounting a second assembly of the inspection apparatus to the floor or floor plate.

Clause 22. The inspection system according to clause 21, wherein the plurality of interface plates are configured to mount a first assembly of the inspection apparatus to the floor or floor plate and a second assembly of the inspection apparatus to the floor or floor plate.

Clause 23. The inspection system according to clause 21 or 22, wherein the first assembly comprises a frame for supporting a stage apparatus of the inspection apparatus, and wherein the second assembly comprises a frame for supporting an inspection tool of the inspection apparatus.

Clause 24. A method of installing an inspection system, the method comprising the steps of:

providing an inspection system comprising a plurality of interface plates according to any of the clauses 1 to 19, and an inspection apparatus;

positioning the plurality of interface plates on the floor or floor plate at locations where the mounting mechanism is able to engage with the floor or floor plate;

adjusting a position or orientation of the install block relative to the floor or floor plate using the adjustment mechanism to enable alignment of the install surfaces of the install blocks to the interface surface of the inspection apparatus or assembly;

mounting the interface plates to the floor or floor plate using the mounting mechanisms; and mounting the inspection apparatus or assembly of the inspection apparatus to the interface plates.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C. While specific embodiments of the disclosure have been described above, it will be appreciated that the disclosure may be practiced otherwise than as described.

The descriptions above are intended to be illustrative, not limiting. Thus, it will be apparent to one skilled in the art that modifications may be made to the disclosure as described without departing from the scope of the claims set out below.

The invention claimed is:

1. An interface plate for mounting an apparatus or an assembly of an apparatus to a floor or floor plate, the interface plate comprising:

an install block having an install surface configured to receive an interface surface of the apparatus or assembly;

an adjustment mechanism located between the install block and the floor or floor plate in a vertical direction, the adjustment mechanism configured to adjust a position or orientation of the install block relative to the floor or floor plate; and a mounting mechanism configured to rigidly mount the install block to the floor or floor plate.

2. The interface plate according to claim 1, wherein the adjustment mechanism comprises a first member configured to engage with the install block, whereby a position of a bottom surface of the first member relative to the install surface is adjustable.

3. The interface plate according to claim 2, wherein the adjustment mechanism further comprises a second member, the second member comprising a bottom surface configured to be positioned on the floor or floor plate and a top surface configured to receive the bottom surface of the first member.

4. The interface plate according to claim 3, wherein the first member and the second member comprise a through hole extending in the vertical direction.

5. The interface plate according to claim 4, wherein the install block comprises a through hole configured to receive a bolt of the mounting mechanism, the through hole of the install block having a clearance to enable the bolt to align with a mounting hole provided in the floor or floor plate.

6. The interface plate according to claim 2, wherein the first member is connected to the install block via a threaded connection, the threaded connection enabling a relative displacement of the bottom surface of the first member and the install surface in the vertical direction.

7. The interface plate according to claim 1, wherein the install block is provided with a plurality of mounting holes for mounting the interface surface of the apparatus or assembly to the install surface of the install block.

8. The interface plate according to claim 1, wherein the interface plate comprises a plurality of adjustment mechanisms.

9. The interface plate according to claim 1, wherein the install block comprises a first set of mounting holes for mounting an interface surface of a first assembly of the apparatus and a second set of mounting holes for mounting an interface surface of a second assembly of the apparatus.

10. The interface plate according to claim 9, wherein:

the first assembly comprises a frame of a stage assembly of an inspection apparatus; and the second assembly comprises a frame of an inspection tool of the inspection apparatus.

11. The interface plate according to claim 1, wherein the interface plate comprises three or more adjustment mechanisms.

12. The interface plate according to claim 11, wherein the adjustment mechanisms are configured to adjust a position of the install block relative to the floor or floor plate in three translational degrees of freedom and three rotational degrees of freedom.

13. The interface plate according to claim 1, wherein the interface plate comprises three or more adjustment mechanisms.

14. The interface plate according to claim 13, wherein:

the install surface has a substantially triangular shape; and the interface plate comprises three adjustment mechanisms arranged at respective corners of the install surface.

15. The interface plate according to claim 13, wherein:

the install surface has a substantially rectangular shape; and the interface plate comprises four adjustment mechanisms arranged at respective corners of the install surface.

16. The interface plate according to claim 15, wherein the install block comprises four through holes configured to receive respective four bolts of the mounting mechanisms, the through holes of the install block configured to having a clearance to enable the four bolts to align with mounting holes provided in the floor or floor plate.

17. The interface plate according to claim 13, wherein the adjustment mechanisms are configured to adjust a position of the install block relative to the floor or floor plate in three translational degrees of freedom and three rotational degrees of freedom.

18. An inspection system, comprising:

an inspection apparatus; and a plurality of interface plates that each comprise:

an install block having an install surface configured to receive an interface surface of the inspection apparatus or an assembly of the apparatus;

an adjustment mechanism located between the install block and a floor or floor plate in a vertical direction, the adjustment mechanism configured to adjust a position or orientation of the install block relative to the floor or floor plate; and a mounting mechanism configured to rigidly mount the install block to the floor or floor plate;

the plurality of interface plates configured to mount the inspection apparatus or the assembly of the apparatus to the floor or floor plate.

19. The inspection system according to claim 18, wherein the plurality of interface plates comprises:

a first set of interface plates for mounting a first assembly of the inspection apparatus to the floor or floor plate; and a second set of interface plates for mounting a second assembly of the inspection apparatus to the floor or floor plate.

20. A method of installing an inspection system, the method comprising:

providing an inspection system comprising an inspection apparatus and a plurality of interface plates that each comprise:

an install block having an install surface configured to receive an interface surface of the inspection apparatus or an assembly of the apparatus;

an adjustment mechanism located between the install block and a floor or floor plate in a vertical direction, the adjustment mechanism configured to adjust a position or orientation of the install block relative to the floor or floor plate; and a mounting mechanism configured to rigidly mount the install block to the floor or floor plate;

positioning the plurality of interface plates on the floor or floor plate at locations where the mounting mechanism is able to engage with the floor or floor plate;

adjusting a position or orientation of the install block relative to the floor or floor plate using the adjustment mechanism to enable alignment of the install surfaces of the install blocks to the interface surface of the inspection apparatus or assembly;

mounting the interface plates to the floor or floor plate using the mounting mechanisms; and mounting the inspection apparatus or assembly of the inspection apparatus to the interface plates.

* * * * *